(12) United States Patent
Goto

(10) Patent No.: US 6,539,611 B2
(45) Date of Patent: Apr. 1, 2003

(54) METHOD OF MANUFACTURING A GRADIENT COIL

(75) Inventor: Takao Goto, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 09/827,525

(22) Filed: Apr. 6, 2001

(65) Prior Publication Data
US 2001/0039717 A1 Nov. 15, 2001

(30) Foreign Application Priority Data
Apr. 19, 2000 (JP) .......................... 2000-117881

(51) Int. Cl.[7] ................................. H01F 7/06
(52) U.S. Cl. .................... 29/606; 29/602.1; 29/605; 336/212; 336/213
(58) Field of Search ............... 29/602.1, 606, 29/605; 336/212, 213

(56) References Cited

U.S. PATENT DOCUMENTS

| 4,571,568 | A | * | 2/1986 | Grangereau | 335/299 |
| 4,721,914 | A | * | 1/1988 | Fukushima et al. | 324/320 |
| 4,829,252 | A | * | 5/1989 | Kaufman | 324/309 |
| 5,084,677 | A | * | 1/1992 | McDougall | 324/320 |
| 5,124,651 | A | * | 6/1992 | Danby et al. | 324/318 |
| 5,250,901 | A | * | 10/1993 | Kaufman et al. | 324/318 |
| 5,317,297 | A | * | 5/1994 | Kaufman et al. | 335/297 |
| 5,363,078 | A | * | 11/1994 | Ries et al. | 335/297 |
| 5,382,904 | A | * | 1/1995 | Pissanetzky | 324/319 |
| 5,382,905 | A | * | 1/1995 | Miyata et al. | 324/319 |
| 5,396,207 | A | * | 3/1995 | Dorri et al. | 335/216 |
| 5,490,509 | A | * | 2/1996 | Carlson et al. | 128/653.2 |
| 5,680,086 | A | * | 10/1997 | Allis et al. | 335/296 |
| 5,825,187 | A | * | 10/1998 | Ohashi et al. | 324/319 |
| 5,939,962 | A | * | 8/1999 | Tahara et al. | 335/216 |
| 6,014,070 | A | * | 1/2000 | Danby et al. | 335/296 |
| 6,064,290 | A | * | 5/2000 | Xu et al. | 335/296 |
| 6,144,204 | A | * | 11/2000 | Sementchenko | 324/318 |
| 6,255,929 | B1 | * | 7/2001 | Xu et al. | 335/299 |
| 6,259,252 | B1 | * | 7/2001 | Laskaris et al. | 324/319 |
| 6,377,049 | B1 | * | 4/2002 | Benz et al. | 324/319 |

FOREIGN PATENT DOCUMENTS

JP    11244259 A  *  9/1999

* cited by examiner

Primary Examiner—Peter Vo
Assistant Examiner—Paul D Kim
(74) Attorney, Agent, or Firm—Moonray Kojima

(57) ABSTRACT

The present invention aims to implement a pair of gradient coils low in magnetizing force with respect to pole pieces. Upon manufacturing a pair of gradient coils each of which produces gradient magnetic fields by currents that flow through a plurality of concentric passes, the maximum radius of one of current passes for the gradient coil is set as the minimum value at which a gradient magnetic field having a magnetic field error within a predetermined allowable range can be produced.

8 Claims, 6 Drawing Sheets

METHOD OF MANUFACTURING A GRADIENT COIL

BACKGROUND OF THE INVENTION

The present invention relates to a gradient coil manufacturing method, a gradient coil and a magnetic resonance imaging system, and particularly to a gradient coil provided on a polar surface of a static magnetic field magnet, a method of manufacturing the same, and a magnetic resonance imaging system having such a gradient coil.

In a magnetic resonance imaging (MRI: Magnetic Resonance Imaging) system, a target to be shot or imaged is carried in an internal bore of a magnet system, i.e., a bore or space in which a static magnetic field is formed. A gradient magnetic field and a high-frequency magnetic field are applied to produce a magnetic resonance signal within the target. A tomogram is produced (reconstructed) based on its received signal.

In a magnet system using permanent magnets for generating static magnetic fields, pole piece for uniformizing a magnetic flux distribution in a static magnetic field space are respectively provided at leading ends of a pair of the permanent magnets opposite to each other. Further, gradient coils for generating gradient magnetic fields are provided on their corresponding polar surfaces of the pole pieces.

In the above-described magnet system, the pole pieces are magnetized by the gradient magnetic fields since the gradient coils are respectively close to the pole pieces. Due to the residual gradient magnetic fields formed by their remanent magnetization, the phase of a spin is subjected to such an influence as though eddy currents extremely long in time constant had existed. Therefore, it would interfere with imaging made by, for example, a fast spin echo (FSE) method or the like which needs accurate phase control.

SUMMARY OF THE INVENTION

Therefore, an object of the present invention is to implement a gradient coil low in magnetizing force with respect to each pole piece, a method of manufacturing the same, and a magnetic resonance imaging system having such a gradient coil.

(1) The invention according to one aspect for solving the above problems is a gradient coil manufacturing method comprising the step of, upon manufacturing a pair of gradient coils which is respectively provided along the surfaces of bottom plate portions lying inside peripheral edge portions of a pair of pole pieces having the bottom plate portions and the peripheral edge portions protruding in the direction orthogonal to the surfaces of the bottom plate portions, the pole pieces being opposed to each other with the protruded peripheral edge portions formed with a space defined therebetween, and which produces gradient magnetic fields in the space by currents that flow through a plurality of concentric passes, setting the maximum radius of one of the passes for each of the gradient coils to the minimum value within a range for producing a gradient magnetic field having a magnetic field error lying within a predetermined allowable range.

In the invention according to this aspect, the maximum radius of one pass for each gradient coil is set to the minimum value at which a gradient magnetic field having a magnetic field error lying within a predetermined allowable range can be produced. Thus, the distance between the outermost pass and a protruded peripheral edge portion of each pole piece increases. Therefore, the magnetizing force with respect to the protruded peripheral edge portion is low and the residual magnetization is low.

(2) The invention according to another aspect for solving the above problems is the gradient coil manufacturing method described in (1), wherein the radii of the plurality of passes are determined according to the following procedures.

Note (a) setting measurement points Pi (where i=1–N) onto the maximum spherical surface supposed in an imaging area.

(b) calculating magnetic fields Bit (where i=1–N) at the measurement points, to be produced by the gradient coils.

(c) setting a tolerance αt for an error with respect to each magnetic field.

(d) setting an allowable value r0 of the maximum radius of the pass for each gradient coil within a range not exceeding a limit value r00.

(e) defining the radii of the plurality of passes as r1, r2, . . . , rM.

$$\max(r1, r2, \ldots, rM) < r0,$$

under the above restricted condition, and $$\vec{r} = (r1, r2, \ldots, r_M)$$

with the above as a parameter, $$\min\left[\sum_{i=1}^{N} \{B_{it} - \hat{B}_i(\vec{r})\}^2\right]$$

determining the optimum values of rj (where j=1–M) using quadratic programming so that the above equation 18 is established. Incidentally, $$\hat{B}_i(\vec{r})$$

the above is calculated using the Biot-Savart's law.

(f) calculating an error in magnetic field at each measurement point Pi according to the following equation.

$$\alpha_i = \frac{\hat{B}_i(\vec{r}) - B_{it}}{B_{it}} \times 100$$

(g) determining rj when αi≦αt is satisfied.

(h) when αi≦αt is not satisfied, increasing the allowable value r0 within a range not exceeding the limit value r00 and (i) repeating the procedures subsequent to (e).

In the invention according to this aspect, the maximum radius of one pass for each gradient coil is set to the minimum value at which a gradient magnetic field having a magnetic field error lying within a predetermined allowable range can be produced. Thus, the distance between the outermost pass and a protruded peripheral edge portion of each pole piece increases. Therefore, the magnetizing force with respect to the protruded peripheral edge portion is low and the residual magnetization is low.

(3) The invention according to a further aspect for solving the above problems is a pair of gradient coils which is respectively provided along the surfaces of bottom plate portions lying inside peripheral edge portions of a pair of pole pieces having the bottom plate portions and the peripheral edge portions protruding in the direction orthogonal to the surfaces of the bottom plate portions, the pole pieces being opposed to each other with the protruded peripheral edge portions formed with a space defined therebetween, and which produces gradient magnetic fields in the space by currents that flow through a plurality of concentric passes, wherein the maximum radius of one of the passes for each of the gradient coils is set to the minimum value within a range for producing a gradient magnetic field having a magnetic field error lying within a predetermined allowable range.

In the invention according to this aspect, the maximum radius of one pass for each gradient coil is set to the minimum value at which a gradient magnetic field having a magnetic field error lying within a predetermined allowable range can be produced. Thus, the distance between the outermost pass and a protruded peripheral edge port of each pole piece increases. Therefore, the magnetizing force with respect to the protruded peripheral edge portion is low and the residual magnetization is low.

(4) The invention according to a still further aspect for solving the above problems is the pair of gradient coils described in (3), wherein the plurality of passes respectively have radii determined according to the following procedures.

Note (a) setting measurement points Pi (where i=1–N) onto the maximum spherical surface supposed in an imaging area.

(b) calculating magnetic fields Bit (where i=1–N) at the measurement points, to be produced by the gradient coils.

(c) setting a tolerance αt for an error with respect to each magnetic field.

(d) setting an allowable value r0 of the maximum radius of the pass for each gradient coil within a range not exceeding a limit value r00.

(e) defining the radii of the plurality of passes as r1, r2, . . . , rM.

$$\max(r1, r2, \ldots, rM) < r0,$$

under the above restricted condition, and $$\vec{r} = (r1, r2, \ldots, r_M)$$

with the above as a parameter, $$\min\left[\sum_{i=1}^{N}\{B_{it} - \hat{B}_i(\vec{r})\}^2\right]$$

determining the optimum values of rj (where j=1–M) using quadratic programming so that the above equation 23 is established. Incidentally, $$\hat{B}_i(\vec{r})$$

the above is calculated using the Biot-Savart's law.

(f) calculating an error in magnetic field at each measurement point Pi according to the following equation.

$$\alpha_i = \frac{\hat{B}_i(\vec{r}) - B_{it}}{B_{it}} \times 100$$

(g) determining rj when αi≦αt is satisfied.

(h) when αi≦αt is not satisfied, increasing the allowable value r0 within a range not exceeding the limit value r00, and (i) repeating the procedures subsequent to (e).

In the invention according to this aspect, the maximum radius of one pass for each gradient coil is set to the minimum value at which a gradient magnetic field having a magnetic field error lying within a predetermined allowable range can be produced. Thus, the distance between the outermost pass and a protruded peripheral edge portion of each pole piece increases. Therefore, the magnetizing force with respect to the protruded peripheral edge portion is low and the residual magnetization is low.

(5) The invention according to a still further aspect for solving the above problems is a magnetic resonance imaging system for forming an image based on magnetic resonance signals acquired using a static magnetic filed, a gradient magnetic field and a high-frequency magnetic field, comprising, a pair of gradient coils configured as gradient coils each of which generates the high-frequency magnetic field, the pair of gradient coils being respectively provided along the surfaces of bottom plate portions lying inside peripheral edge portions of a pair of pole pieces having the bottom plate portions and the peripheral edge portions protruding in the direction orthogonal to the surfaces of the bottom plate portions, the pole pieces being opposed to each other with the protruded peripheral edge portions formed with a space defined therebetween, and which produces gradient magnetic fields in the space by currents that flow through a plurality of concentric passes, and wherein the maximum radius of the pass is set to the minimum value within a range for producing a gradient magnetic field having a magnetic field error lying within a predetermined allowable range.

In the invention according to this aspect, the maximum radius of one pass for each gradient coil is set to the minimum value at which a gradient magnetic field having a magnetic field error lying within a predetermined allowable range can be produced. Thus, the distance between the outermost pass and a protruded peripheral edge portion of each pole piece increases. Therefore, the magnetizing force with respect to the protruded peripheral edge portion is low and the residual magnetization is low. Thus, imaging on which the residual magnetization has a little effect, can be carried out.

(6) The invention according to a still further aspect for solving the above problems is the magnetic resonance imaging system described in (5), wherein the plurality of passes respectively have radii determined according to the following procedures.

Note (a) setting measurement points Pi (where i=1–N) onto the maximum spherical surface supposed in an imaging area.

(b) calculating magnetic fields Bit (where i=1–N) at the measurement points, to be produced by the gradient coils.

(c) setting a tolerance at for an error with respect to each magnetic field.

(d) setting an allowable value r0 of the maximum radius of the pass for each gradient coil within a range not exceeding a limit value r00.

(e) defining the radii of the plurality of passes as r1, r2, ..., rM.

$$\max(r1, r2, \ldots, rM) < r0,$$

under the above restricted condition, and $$\vec{r} = (r1, r2, \ldots, r_M)$$

with the above as a parameter, $$\min\left[\sum_{i=1}^{N}\{B_{it} - \hat{B}_i(\vec{r})\}^2\right]$$

determining the optimum values of rj (where j=1–M) using quadratic programming so that the above equation 28 is established. Incidentally, $$\hat{B}_i(\vec{r})$$

the above is calculated using the Biot-Savart's law.

(f) calculating an error in magnetic field at each measurement point Pi according to the following equation.

$$\alpha_i = \frac{\hat{B}_i(\vec{r}) - B_{it}}{B_{it}} \times 100$$

(g) determining rj when $\alpha_i < \alpha_t$ is satisfied.

(h) when $\alpha_i < \alpha_t$ is not satisfied, increasing the allowable value r0 within a range not exceeding the limit value r00, and (i) repeating the procedures subsequent to (e).

In the invention according to this aspect, the maximum radius of one pass for each gradient coil is set to the minimum value at which a gradient magnetic field having a magnetic field error lying within a predetermined allowable range can be produced. Thus, the distance between the outermost pass and a protruded peripheral edge portion of each pole piece increases. Therefore, the magnetizing force with respect to the protruded peripheral edge portion is low and the residual magnetization is low. Thus, imaging on which the residual magnetization has a little effect, can be carried out.

According to the present invention, a gradient coil reduced in magnetizing force with respect to a pole piece, a manufacturing method therefor, and a magnetic resonance imaging system having such a gradient coil can be implemented.

Further objects and advantages of the present invention will be apparent from the following description of the preferred embodiments of the invention as illustrated in the accompanying drawings.

DETAILED DESCRIPTION OF THE INVENTION

Figure 1:
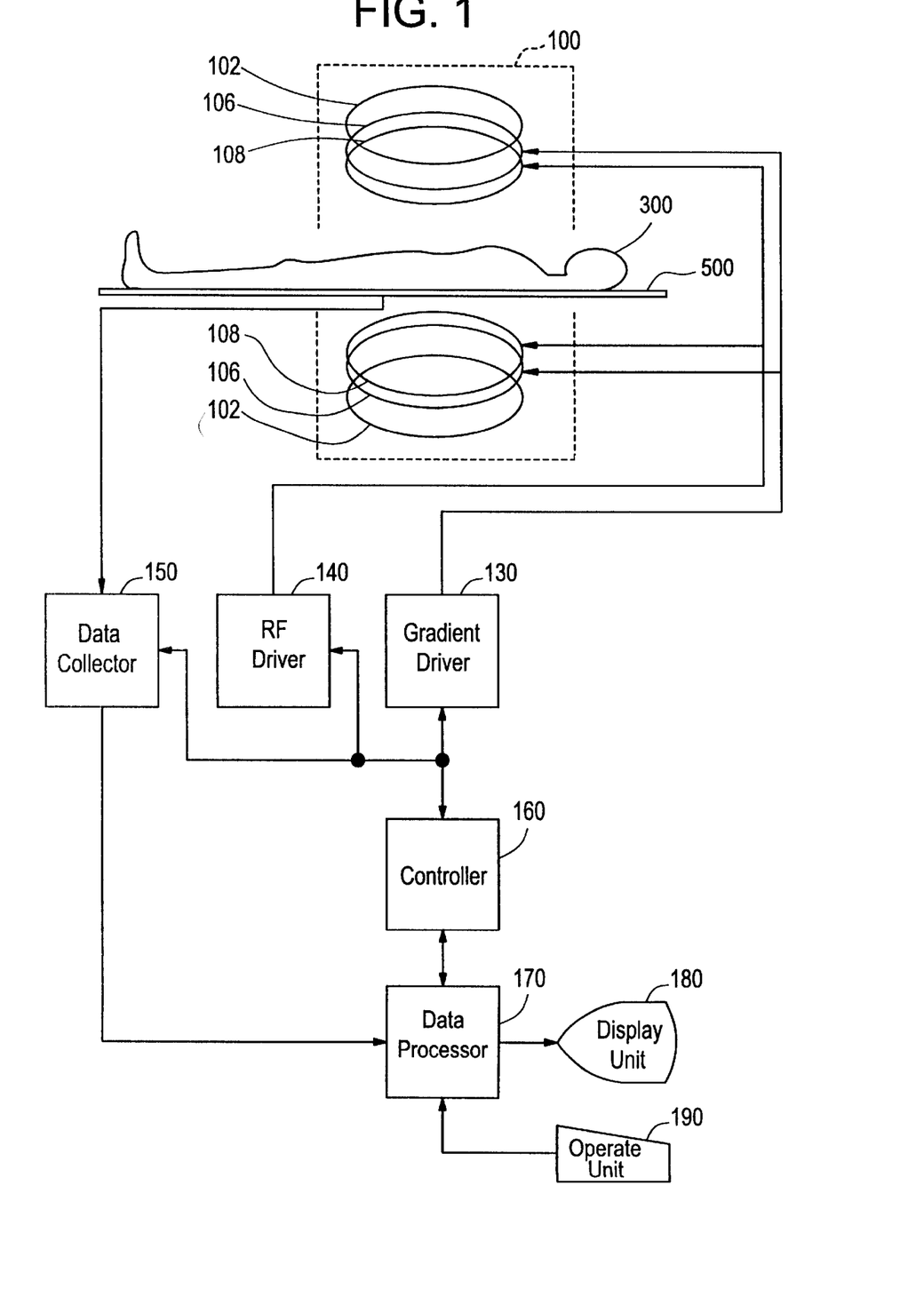
FIG. 1 is a block diagram of a system showing one example of an embodiment according to the present invention.
Figure 2A:
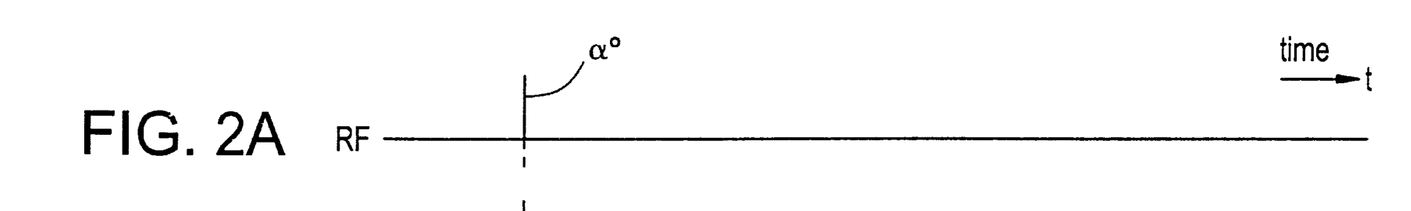
FIG. 2 is a diagram showing one example of a pulse sequence executed by the system shown in FIG. 1.
Figure 2B:
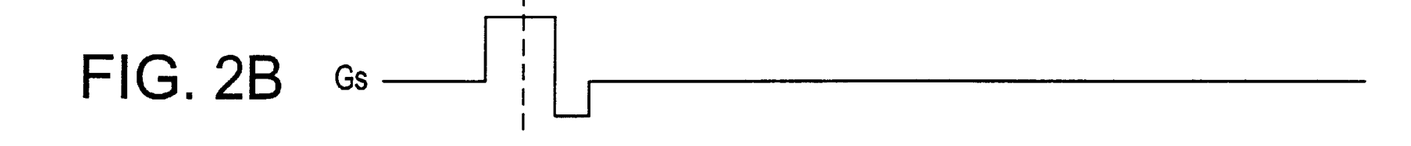
Figures 2C, 2D:
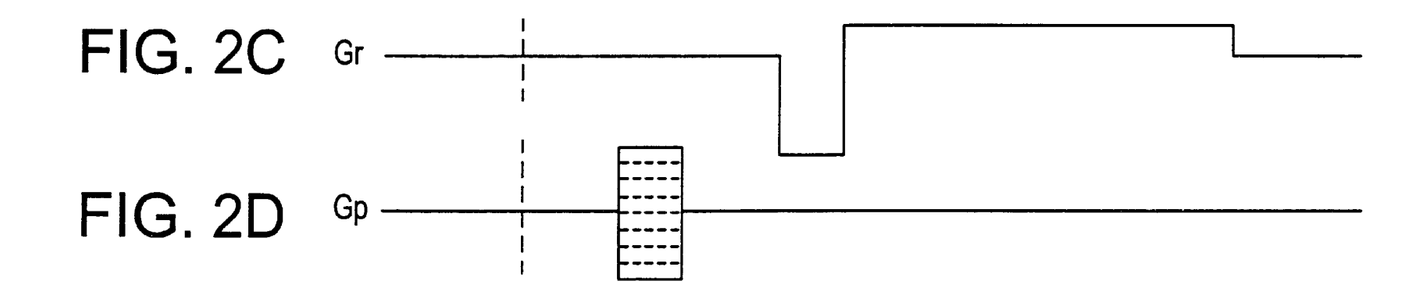
Figure 2E:
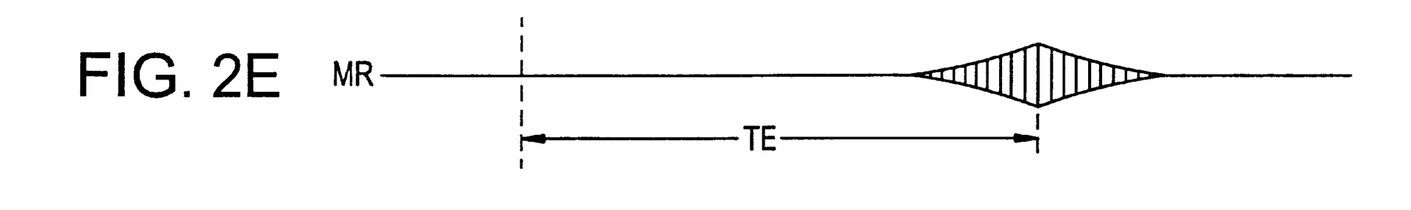
Figure 3A:
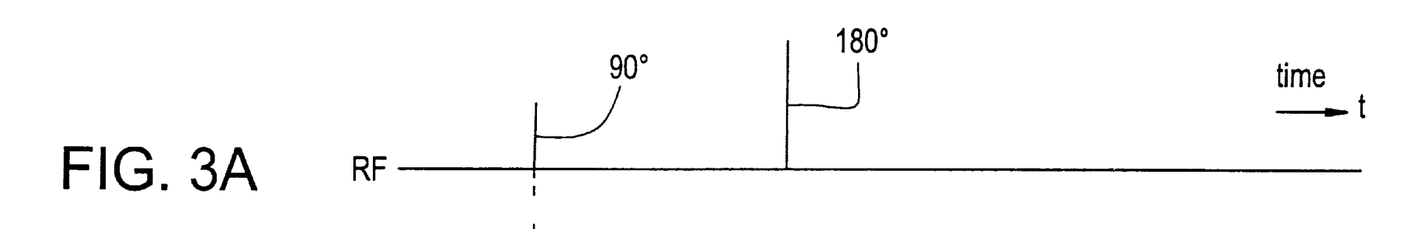
FIG. 3 is a diagram illustrating one example of a pulse sequence executed by the system shown in FIG. 1.
Figure 3B:
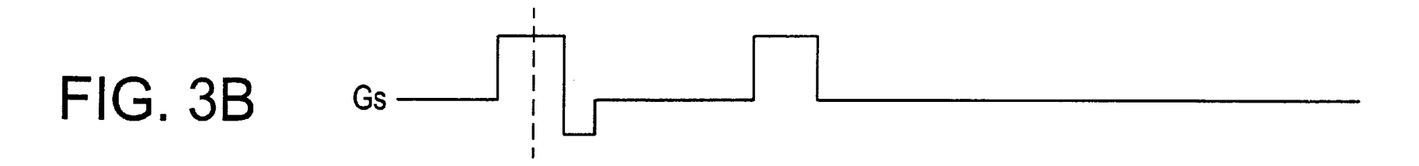
Figure 3C:
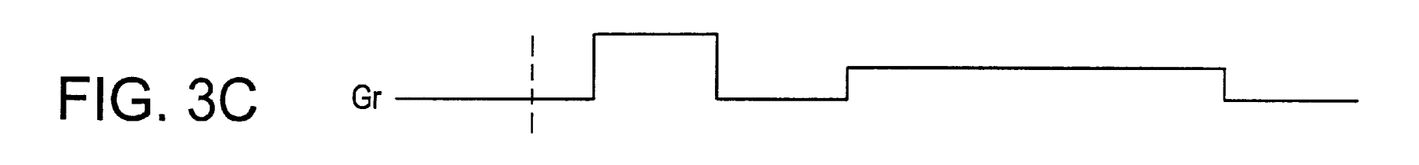
Figure 3D:
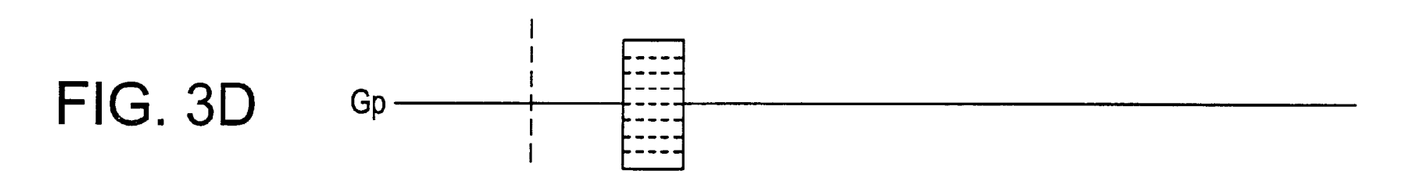
Figure 3E:
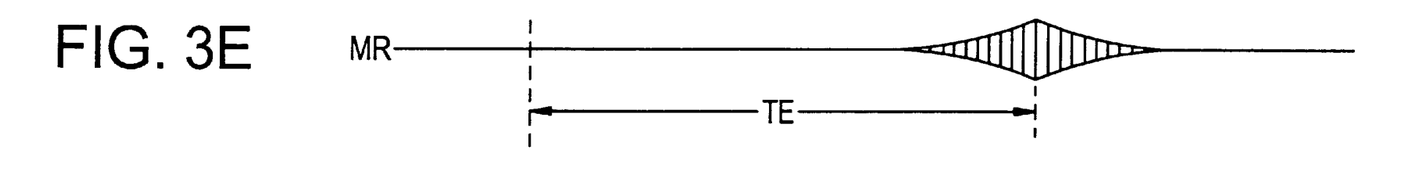

Preferred embodiments of the present invention will hereinafter be described in detail with reference to the accompanying drawings. A block diagram of a magnetic resonance imaging system is shown in FIG. 1. The present system is one example of an embodiment of the present invention. One example of an embodiment related to a system of the present invention is shown according to the configuration of the present system.

As shown in FIG. 1, the present system has a magnetic system 100. The magnetic system 100 has main magnetic field magnet units 102, gradient coil units to 106 and RF (radio frequency) coil units 108. Any of these main magnetic field magnet units 102 and respective coil units comprises paired ones opposed to one another with a space interposed therebetween. Further, any of them has a substantially disc shape and is placed with its central axis held in common. A target 300 is placed on a cradle 500 in an internal bore of the magnetic system 100 and carried in and out by unillustrated conveying means.

Each of the main magnetic field magnet units 102 forms a static magnetic field in the internal bore of the magnetic system 100. The direction of the static magnetic field is approximately orthogonal to the direction of the body axis of the target 300. Namely, each of the main magnetic field magnet units 102 forms a so-called vertical magnetic field. Each of the main magnetic field magnet units 102 is configured using a permanent magnet or the like, for example. Incidentally, the main magnetic field magnet unit 102 is not limited to the permanent magnet and may of course be configured using a superconductive electromagnet or a normal conductive electromagnet or the like.

The gradient coil units 106 produce gradient magnetic fields used for causing the intensity of the static magnetic field to have a gradient or slope. The produced gradient magnetic fields include three types of gradient magnetic fields of a slice gradient magnetic field, a read out gradient magnetic field and a phase encode gradient magnetic field. The gradient coil unit 106 has unillustrated 3-systematic gradient coils in association with these three types of gradient magnetic fields.

The three-systematic gradient coils respectively produce three gradient magnetic fields for applying gradients to static magnetic fields respectively as viewed in three directions orthogonal to one another. One of the three directions corresponds to the direction (vertical direction) of the static magnetic field and is normally defined as an z direction. Another one thereof corresponds to a horizontal direction and is normally defined as a y direction. The remaining one corresponds to the direction orthogonal to the z and y directions and is normally defined as an x direction. The x direction is orthogonal to the z direction within the vertical plane and perpendicular to the y direction within the horizontal plane. x, y and z are also called gradient axes below.

Any of x, y and z can be set as an axis for a slice gradient. When any of them is set as the slice gradient axis, one of the remaining two is set as an axis for a phase encode gradient and the other thereof is set as an axis for a read out gradient. The 3-systematic gradient coils will be explained again later.

Each of the RF coil units 108 transmits an RF excitation signal for exciting a spin in a body of the target 300 to a static magnetic field space. Further, the RF coil unit 108 receives therein a magnetic resonance signal which produces the excited spin. The RF coil unit 108 has unillustrated transmitting and receiving coils. The transmitting coil and the receiving coil share the use of the same coil or make use of dedicated coils respectively.

A gradient driver 130 is connected to the gradient coil units 106. The gradient driver 130 supplies a drive signal to each of the gradient coil units 106 to generate a gradient magnetic field. The gradient driver 130 has unillustrated 3-systematic drive circuits in association with the 3-systematic gradient coils in the gradient coil unit 106.

A RF driver 140 is connected to the RF coil units 108. The RF driver 140 supplies a drive signal to each of the RF coil units 108 to transmit an RF excitation signal, thereby exciting the spin in the body of the target 300.

A data collector 150 is connected to each of the RF coil units 108. The data collector 150 takes in or captures signals received by the RF coil units 108 and collects the same as view data (view data).

A controller 160 is connected to the gradient driver 130, the RF driver 140 and the data collector 150. The controller 160 controls the gradient driver 130 to data collector 150 respectively to execute shooting or imaging.

The output side of the data collector 150 is connected to a data processor 170. The data processor 170 is configured using a computer (computer) or the like, for example. The data processor 170 has an unillustrated memory. The memory stores a program and various data for the data processor 170 therein. The function of the present system is implemented by allowing the data processor 170 to execute the program stored in the memory.

The data processor 170 causes the memory to store the data captured from the data collector 150. A data space is defined in the memory. The data space forms a two-dimensional Fourier space. The data processor 170 transforms these data in the two-dimensional Fourier space into two-dimensional inverse Fourier form to thereby produce (reconstruct) an image for the target 300. The two-dimensional Fourier space is also called a "k-space".

The data processor 170 is connected to the controller 160. The data processor 170 ranks ahead of the controller 160 and generally controls it. Further, a display unit 180 and an operation or control unit 190 are connected to the data processor 170. The display unit 180 comprises a graphic display or the like. The operation unit 190 comprises a keyboard or the like provided with a pointing device.

The display unit 180 displays a reconstructed image and various information outputted from the data processor 170. The operation unit 190 is operated by an operator and inputs various commands and information or the like to the data processor 170. The operator controls the present system on an interactive basis through the display unit 180 and the operation unit 190.

FIG. 2 shows one example of a pulse sequence used when imaging or shooting is done by the present system. The present pulse sequence corresponds to a pulse sequence of a gradient echo (GRE) method.

Namely, (1) shows a sequence of a α° pulse for RF excitation employed in the GRE method. (2), (3), (4) and (5) similarly respectively show sequences of a slice gradient Gs, a read out gradient Gr, a phase encode gradient Gp and a gradient echo MR. Incidentally, the α° pulse is typified by a center signal. The pulse sequence proceeds from left to right along a time axis t.

As shown in the same drawing, α° excitation for the spin is carried out based on the α° pulse. A flip angle α° is less than or equal to 90°. At this time, the slice gradient Gs is applied to effect selective excitation on a predetermined slice.

After the α° excitation, the spin is phase-encoded based on the phase encode gradient Gp. Next, the spin is first dephased based on the read out gradient Gr. Next, the spin is rephased to generate each gradient echo MR. The signal strength of the gradient echo MR reaches a maximum after an echo time TE has elapsed since the excitation. The gradient echo MR is collected as view data by the data collector 150.

Such a pulse sequence is repeated 64 to 512 times in a cycle. Try (repetition time). Each time it is repeated, the phase encode gradient Gp is changed and different phase encodes are carried out every time. Thus, view data for 64 to 512 views for filing in a k space can be obtained.

Another example of a pulse sequence for magnetic resonance imaging is shown in FIG. 3. The pulse sequence corresponds to a pulse sequence of a spin echo (SE) method.

Namely, (1) shows a sequence of a 90° pulse and a 180° 0 pulse for RF excitation employed in the SE method. (2), (3), (4) and (5) similarly respectively show sequences of a slice gradient Gs, a read out gradient Gr, a phase encode gradient Gp and a spin echo MR. Incidentally, the 90° pulse and 180° pulse are respectively typified by center signals. The pulse sequence proceeds from left to right along a time axis t.

As shown in the same drawing, 90° excitation for the spin is carried out based on the 90° pulse. At this time, the slice gradient Gs is applied to effect selective excitation on a predetermined slice. After a predetermined time has elapsed since the 90° excitation, 180° excitation based on the 180° pulse, i.e., spin inversion is carried out. Even at this time, the slice gradient Gs is applied to effect selective inversion on the same slice.

The read out gradient Gr and the phase encode gradient Gp are applied during a period between the 90° excitation and the spin reversal. The spin is dephased based on the read out gradient Gr. Further, the spin is phase-encoded based on the phase encode gradient Gp.

After the spin reversal, the spin is rephased based on the read out gradient Gr to produce each spin echo MR. The signal strength of the spin echo MR reaches a maximum after TE has elapsed since the 90° excitation. The spin echo MR is collected as view data by the data collector 150. Such a pulse sequence is repeated 64 to 512 times in a cycle TR. Each time it is repeated the phase encode gradient Gp is changed and different phase encodes are carried out every time. Thus, view data for 64 to 512 views for filling in a k space can be obtained.

Incidentally, the pulse sequence used for imaging is not limited to the GRE method or SE method. The pulse sequence may be other suitable techniques such as an FSE (Fast Spin Echo) method, a fast recovery FSE (Fast Recovery Fast Spin Echo) method, echo planar imaging (EPI), etc.

The data processor 170 transforms the view data in the k space into two-dimensional inverse Fourier form to thereby reconstruct a tomogram for the target 300. The reconstructed image is stored in its corresponding memory and displayed on the display unit 180.

Figure 4:
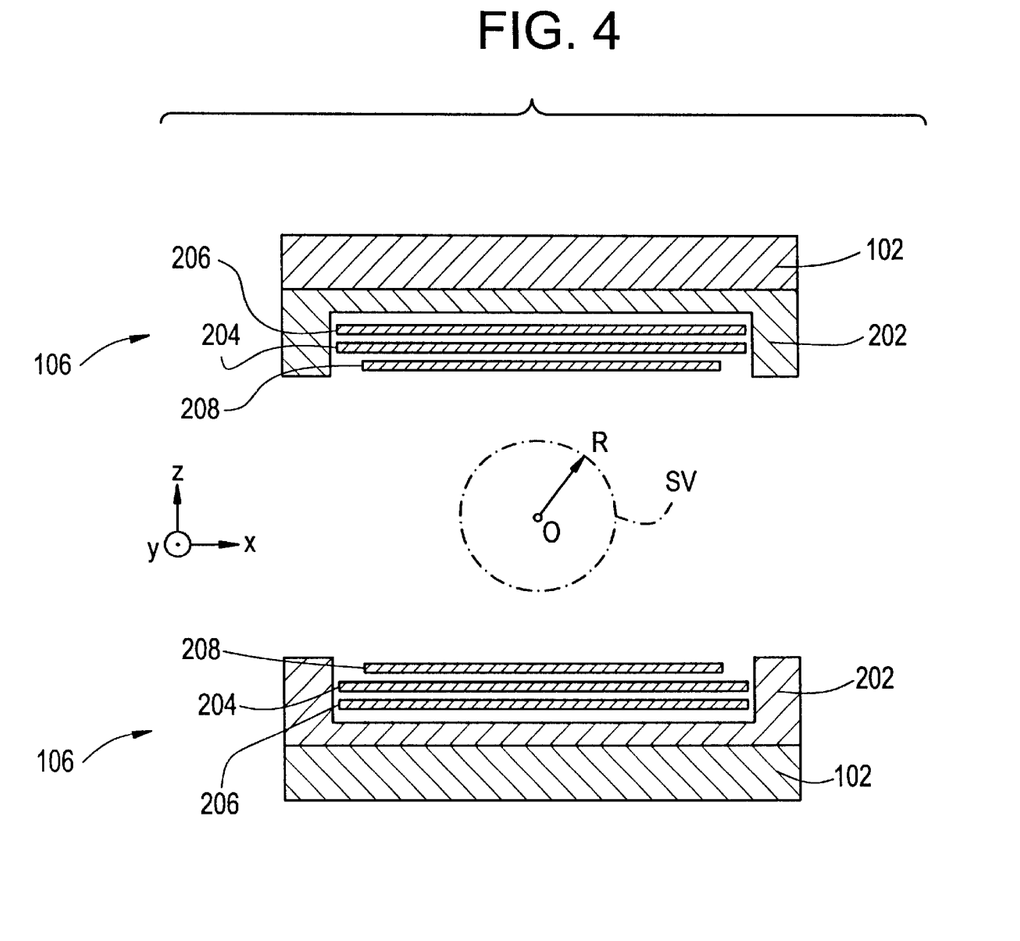
FIG. 4 is a typical diagram showing a configuration of the neighborhood of a gradient coil of a magnet system employed in the system shown in FIG. 1.

FIG. 4 typically shows the structure of the magnet system 100 located in the neighborhood of the gradient coil units 106 in the form of a cross-sectional view. In the same drawing, O indicates the center of a static magnetic field, i.e., a magnet center, and x, y and z indicate the aforementioned three directions respectively.

A spheric volume SV of a radius R with the magnet center O as the center is a shooting or imaging area. The magnet system 100 is configured so that the static magnetic field and gradient magnetic field respectively have a predetermined accuracy in the SV.

A pair of main magnetic field magnet units 102 has a pair of pole pieces 202 opposed to each other. The pole piece 202 is composed of a magnetic material having high permeability, such as a soft iron or the like and serves so as to uniformize a magnetic flux distribution in a static magnetic field space.

The pole pieces 202 are respectively shaped substantially in the form of discs but protrude in the direction (z direction) in which, their peripheral edge portions are orthogonal to their plate surfaces, i.e., in the direction in which the pole pieces 202 are opposed to each other. Thus, the pole pieces 202 have bottom plate portions and protruded peripheral edge portions. The protruded peripheral edge portions serve so as to make up for reductions in magnetic flux density at the peripheral edges of the pole pieces 202.

The gradient coil units 106 are respectively provided in their corresponding concave portions of the pole pieces 202, which are defined inside the protruded peripheral edge portions. Each of the gradient coil units 106 has an X coil 204, a Y coil 206 and a Z208 coil.

Of these, the Z coil 208 is one example of an embodiment of a gradient coil employed in the present invention. Any of the respective coils is shaped substantially in the form of a disc. The respective coils are mounted on a polar surface of the pole piece 202 by unillustrated suitable mounting means so that they are successively layered.

Figure 5:
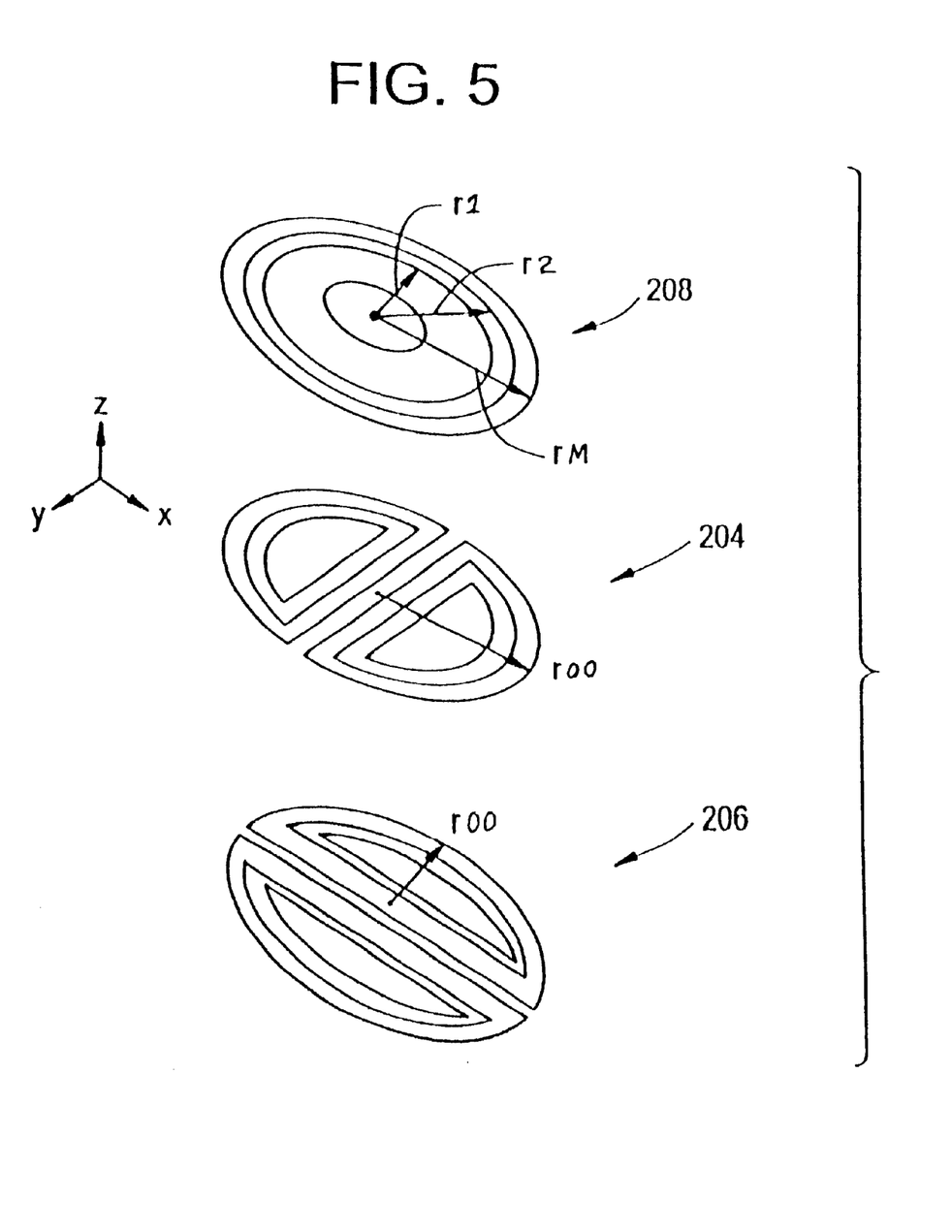
FIG. 5 is a schematic illustration showing patterns for current passes of a gradient coil.

Patterns for current passes of the X coil 204, Y coil 206 and Z208 coil are shown in FIG. 5 by a diagrammatic illustration. As shown in the same drawing, the X coil 204 has linear plural main current passes (main passes) parallel to a y direction at a portion near the center of a circle. These main passes are symmetric with respect to a y axis which passes through the center of the circle. Return passes for the main passes are formed along the circumference of the circle. The radius of the outermost return pass, i.e., the outside diameter of the X coil 204 is given as r00.

The Y coil 206 has linear plural main passes parallel to an x direction at a portion near the center of a circle. These main passes are symmetric with respect to an x axis which passes through the center of the circle. Return passes for the main passes are formed along the circumference of the circle. The radium of the outermost return pass, i.e., the outside diameter of the Y coil 206 is given as r00.

The Z coil 208 has a plurality of current passes which form concentric circles respectively. These current passes are all main passes. The radii of the respective main passes are given as r1, r2, . . . , rM in order from inside. rM is defined as the outer diameter of the Z coil 208.

Since the Z coil 208 has no return passes, it is easy to generate a gradient magnetic field good in linearity as compared with those having return passes as in the case of the X coil 204 and the Y coil 206.

Thus, even if the outside diameter rM of the Z coil 208 is set smaller than the outside diameters r0 of the X coil and the Y coil 206, the Z coil 208 can produce a gradient magnetic field having linearity equivalent to that of each of the X coil and the Y coil 206.

Since the distance from the outer periphery of the Z coil 208 to each peripheral protruded portion of the pole piece 202 is increased when the outside diameter rM of the Z coil 208 is reduced, the magnetizing force of each protruded portion by the Z coil 208 becomes weak in proportion to the square of the distance. Accordingly, the residual magnetization of each pole piece 202 can be lowered by reducing the outside diameter rM of the Z coil 208.

Incidentally, the magnetization of each protruded portion by the X coil 204 and the Y coil 206 produces a little influence as compared with that by the Z coil because the magnetization intensities developed by the main passes and return passes act so as to be opposite to one another in polarity.

The use of such a magnet system small in residual magnetization makes it possible to properly perform even shooting or imaging by, for example, the FSE method or the like which requires accurate phase control on the spin.

A method of manufacturing such a Z coil 208 will next be described. The radii r1, r2, . . . , rM of the plurality of current passes that constitute the main passes, i.e., the concentric circles respectively, are determined upon manufacturing the Z coil 208.

Figure 6:
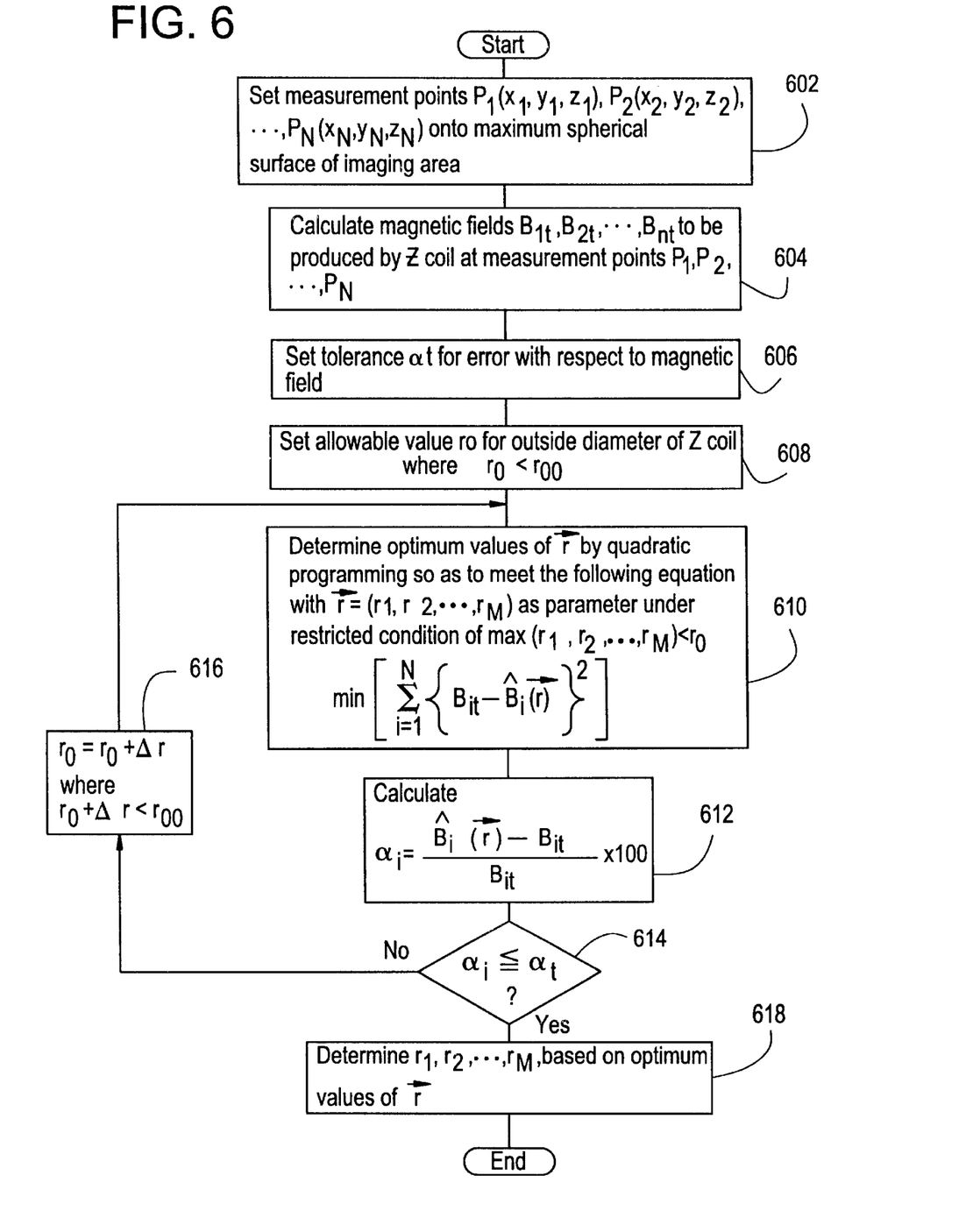
FIG. 6 is a flowchart for describing the procedure of determining radii of current passes.

FIG. 6 shows a flow chart for describing the procedure of determining the radii of the main passes. As shown in the same drawing, in Step 602, N points to be measured P1 (x1, y1, z1), P2 (x2, y2, z2), . . . , PN (xN, yN, zN) are set onto the maximum spherical surface of an imaging area, i.e., the surface of SV shown in FIG. 4.

Next, in Step 604, magnetic fields B1t, B2t, . . . , BNt to be produced by each Z coil 208 at the measurement points P1, P2, . . . , PN are calculated. The following equation is used to calculate the magnetic fields.

$$B_{it} = g \cdot z_i \quad (i=1-N) \tag{1}$$

where, g: magnetic field gradient

Next, in Step 606, an allowable value or tolerance $\alpha t$ on an error with respect to each magnetic field is set. $\alpha t$ is set so as to be equal to a tolerance on an error with respect to each of the X coil 204 and the Y coil 206.

Next, in Step 608, a tolerance or allowable value r0 for the outside diameter of the Z coil 208 is set. The r0 is, set within a range not exceeding a limit value r00. The limit value r00 corresponds to each of the outside diameters of the X coil 204 and the Y coil 206.

Next, in Step 610, the optimum values of the radii r1, r2, . . . , rM of the plural main passes for the Z coil 208 are determined. Namely, $$\max(r1, r2, \ldots, rM) < r0$$

Under the above restricted condition, $$\vec{r} = (r1, r2, \ldots, r_M)$$

the above is used as a parameter.

$$\min\left[\sum_{i=1}^{N} \{B_{it} - \hat{B}_i(\vec{r})\}^2\right]$$

The optimum values of rj (where j=1–M) are determined using quadratic programming so that the above is established.

$$\hat{B}_i(\vec{r})$$

Incidentally, the above is calculated using the Biot-Savart's law.

Next, in Step 612, an error in magnetic field at a measurement point Pi is calculated according to the following equation.

$$\alpha_i = \frac{\hat{B}_i(\vec{r}) - B_{it}}{B_{it}} \times 100 \quad (2)$$

Next, it is determined in Step 614 whether $\alpha i \leq \alpha t$ is satisfied.

If the answer is found to be negative, then the allowable value r0 is incremented by $\Delta r$ within the range not exceeding the limit value r00 in Step 616, and the routine procedure subsequent to Step 610 is repeated.

When $\alpha i \leq \alpha t$ is satisfied, r1, r2, ..., rM are determined in Step 618. The Z coil 208 having the plurality of main passes, which constitute the concentric circles having the determined radii, is manufactured.

Since the allowable value of error with respect to the magnetic field is set to the same allowable value as each of the X coil 204 and the Y coil 206, the maximum radius rM obtained according to the above procedure results in a minimum value at which a magnetic field having an accuracy of an allowable range can be produced. This value results in one smaller than the outside diameter r00 of each of the X coil 204 and the Y coil 206.

Many widely different embodiments of the invention may be configured without departing from the spirit and the scope of the present invention. It should be understood that the present invention is not limited to the specific embodiments described in the specification, except as defined in the appended claims.

What is claimed is:

1. A gradient coil manufacturing method comprising the steps of:
    providing a pair of pole pieces each having a bottom plate portion and a peripheral edge portion protruding in a direction orthogonal to surfaces of said bottom plate portion, with said pole pieces being disposed opposite each other with the protruded peripheral edge portion formed with a space defined therebetween;
    manufacturing a pair of gradient coils having concentric passes and disposed along said surfaces of said bottom plate portion which produces a gradient magnetic field in said space by current that flows through said concentric passes;
    setting a maximum radius of one of said passes for each of said pair of gradient coils to a minimum value with a range for producing said gradient magnetic field having a magnetic field error within a predetermined range; and
    determining radii of said passes according to the following procedure:
        (a) Setting measurement points Pi (wherein i=1-N) onto a maximum spherical surface supposed in an imaging area;
        (b) calculating magnetic fields Bit (wherein i=1-N) at measurement points, to be produced by said gradient coils;
        (c) setting a tolerance $\alpha t$ for an error with respect to each magnetic field;
        (d) setting a value r0 of maximum radius of a pass for said each gradient coil within a range not exceeding a limit value r00;
        (e) defining radii of said passes as r1, r2, ... rM, and max (r1, r2, ..., rM)<r0, under the above restricted condition, and $\vec{r}$ =(r1, r2, ..., $r_M$), with the above as a parameter, $$\min\left[\sum_{i=1}^{N} \{B_{it} - \hat{B}_i(\vec{r})\}^2\right]$$

determining optimum values of rj (wherein j=1-M) using quadratic programming so that the last above equation of this step (e) is established, wherein the following is calculated using Biot-Savart's law; $\hat{B}_i(\vec{r})$:
        (f) calculating an error in magnetic field at each measurement point Pi according to the following equation:

$$\alpha_i = \frac{\hat{B}_i(\vec{r}) - B_{it}}{B_{it}} \times 100$$

(g) determining rj when $\alpha i \leq \alpha t$ is satisfied;
        (h) when $\alpha i \leq \alpha t$ is not satisfied, increasing the value r0 to be within a range not exceeding said limit value r00; and
        (i) repeating the foregoing procedure subsequent to step (e).

2. The method of claim 1, wherein said pair of gradient coils are manufactured so that each comprises a first and a second flat coils arranged on top of each other with said passes being arranged in orthogonally disposed directions, and wherein a maximum value of each said first and second flat coils is within a minimum radius.

3. The method of claim 2, wherein said pair of gradient coils bits are manufactured so that each comprises a third flat coil which has concentrically disposed windings.

4. The method of claim 3, wherein said third flat coil is manufactured so as to be arranged to be on top of said first and second flat coils.

5. The method of claim 2, wherein said first and second flat coils are manufactured so as to be arranged to be on top of each other and disposed within said peripheral edge portions.

6. A gradient coil manufacturing method comprising the steps of:
    providing a pair of pole pieces each having a bottom plate portion and a peripheral edge portion protruding in a direction orthogonal to surfaces of said bottom plate portion, with said pole pieces being disposed opposite each other with the protruded peripheral edge portion formed with a spaced defined therebetween;
    manufacturing a pair of gradient coils having concentric passes and disposed along said surfaces of said bottom plate portion which produces a gradient magnetic field in said space by current that flows through said concentric passes, each of said pair of gradient coils comprising a first and a second flat coils arranged on top of each other with passes being arranged in orthogonally disposed directions, and a third flat coil which has concentrically disposed windings; and
    wherein a maximum radius of each of said first and second flat coils is set to be within a maximum radius of said third flat coil.

7. The method of claim 6, wherein said first and second flat coils are arranged to be on top of each other and disposed within said peripheral edge portions.

8. The method of claim 6, wherein said third flat coil is arranged on top of said first and second flat coils.

* * * * *